United States Patent [19]
Yamamoto et al.

[11] Patent Number: 4,651,186
[45] Date of Patent: Mar. 17, 1987

[54] FIELD EFFECT TRANSISTOR WITH IMPROVED WITHSTAND VOLTAGE CHARACTERISTIC

[75] Inventors: Makoto Yamamoto; Tsuyoshi Toyama; Hirokazu Harima; Ryo Ando, all of Itami, Japan

[73] Assignee: Mitsubishi Denki Kabushiki Kaisha, Tokyo, Japan

[21] Appl. No.: 438,336

[22] Filed: Nov. 1, 1982

[30] Foreign Application Priority Data

Nov. 18, 1981 [JP] Japan ................................ 56-186001
Jul. 16, 1982 [JP] Japan ................................ 57-126570

[51] Int. Cl.$^4$ .................. H01L 29/78; H01L 27/02; H01L 29/34; H01L 29/04
[52] U.S. Cl. ........................ 357/23.8; 357/23.14; 357/42; 357/52; 357/54; 357/59
[58] Field of Search ............. 357/23.5, 41, 23.8, 357/23.1, 23.3, 23.14, 53, 59 J, 54; 365/185

[56] References Cited

U.S. PATENT DOCUMENTS

| | | | |
|---|---|---|---|
| 4,229,756 | 10/1980 | Sato et al. ........................ | 357/56 |
| 4,240,195 | 12/1980 | Clemens et al. .................. | 357/41 |
| 4,290,077 | 9/1981 | Ronen ............................... | 357/41 |
| 4,308,549 | 12/1981 | Yeh ................................... | 357/23.8 |
| 4,379,343 | 4/1983 | Moyer ............................. | 357/23 VT |
| 4,380,804 | 4/1983 | Lockwood et al. ............. | 357/23 VT |
| 4,385,308 | 5/1983 | Uchida .............................. | 357/23.5 |
| 4,414,560 | 11/1983 | Lidow ................................ | 357/41 |
| 4,429,237 | 1/1984 | Cranford, Jr. et al. ............ | 357/23.8 |

FOREIGN PATENT DOCUMENTS

| | | | |
|---|---|---|---|
| 0020164 | 5/1980 | European Pat. Off. . | |
| 50-114182 | 9/1975 | Japan ................................ | 357/23 R |
| 53-68986 | 6/1978 | Japan ............................. | 357/23 MG |
| 56-4281 | 1/1981 | Japan ............................. | 357/23 HV |

OTHER PUBLICATIONS

D. M. Erb et al., "Electron Gate Currents and Threshold Stability on the n-Channel Stocked Gate MOS Tetrode, *IEEE Transactions on Electron Devices*, vol. ED-18 (1971) pp. 105-109.

*Primary Examiner*—J. Carroll
*Attorney, Agent, or Firm*—Lowe Price LeBlanc Becker & Shur

[57] ABSTRACT

A field effect transistor comprises a source region (42) annularly formed to encompass and spaced apart from a drain region (41), whereby a second channel region is formed between the drain region and the source region in the vicinity of the former, while a first channel region is formed in the remaining area thereof, an annular first gate (43) formed bridging above the first channel region and the source region, a second annular gate (45) formed bridging above the first gate and the drain region, and an isolating film (47) formed contiguous to the source region at the side opposite to the channel region. As a result any region is eliminated where the channel region in the vicinity of the drain side end of the first gate (43) is in contact with the isolating film (47). Accordingly, no withstand voltage is restricted thereby and the withstand voltage of the field effect transistor is considerably enhanced.

22 Claims, 13 Drawing Figures

FIELD EFFECT TRANSISTOR WITH IMPROVED WITHSTAND VOLTAGE CHARACTERISTIC

BACKGROUND OF THE INVENTION

1. Field of the Invention

The present invention relates to a field effect transistor, particularly suited for series connection with a memory transistor constituting an erasable and programmable read only memory. More specifically, the present invention relates to a two-layered gate field effect transistor having an increased withstand voltage structure.

2. Description of the Prior Art

The degree of integration of integrated circuits employing field effect transistors has been remarkably increased from year to year. In general, the increase of the degree of integration in integrated circuits has been performed by decreasing the thickness of a gate film and by reducing the transistor geometry, in particular the channel length, by decreasing the depth of the impurity layers of the sources and drains of the field effect transistors. Although such transistors of reduced geometry have no problems when the same are operated at a low voltage, various problems arise in conjunction with the withstand voltage when the same are operated at a high voltage. In the case of a large scale integration memory utilizing a high voltage, such as an erasable and programmable read only memory employing a memory transistor of a floating gate structure, an influence is caused thereby as a noise margin with respect to a breakdown of a program voltage source. The reason is that the voltage source of an erasable and programmable read only memory may be as small as 5 V on the occasion of a read operation but the same needs to be at voltage as high as 21 to 25 V on the occasion of a write operation for injecting electric charges into floating gates of the memory transistors having a floating gate structure. Since such memories need an increased scale of integration, it is required that transistors having an ample withstand voltage be provided in spite of reduced geometry.

For example, generally, such a schematic circuit configuration for one bit as shown in FIG. 1 may be considered for use in a large scale integration memory employing memory transistors for the purpose of an erasable and programmable read only memory. The FIG. 1 circuit configuration comprises a high withstand voltage MOS transistor 1 having a drain connection to a voltage source $V_{PP}$ and having a gate $G_1$ connected to receive a data input signal, a Y-gate MOS transistor 2 having a drain connected to the source of the high withstand voltage MOS transistor 1 and having a gate $G_2$ connected to receive a Y-decode signal, and a memory transistor 3 constituting an erasable and programmable read only memory having a drain connected to the source of the Y-gate MOS transistor 2, having a source connected to the ground and having a control gate $G_3$ connected to receive an X-decode signal, the junction 4 of the source of the above described high withstand voltage MOS transistor 1 and the drain of the Y-gate MOS transistor 2 being connected to a sense amplifier, not shown.

With such a circuit configuration, a write operation of the data into the memory transistor 3 is performed by applying to the gate $G_1$ of the high withstand voltage MOS transistor 1, the gate $G_2$ of the Y-gate MOS transistor 2 and the gate $G_3$ of the memory transistor 3 the same voltage as the source voltage $V_{PP}$ (in this case the voltage of the voltage source $V_{PP}$ is 21 to 25 V) and by storing electrons in the floating gate of the memory transistor 3. Accordingly, it is necessary to control a relatively large voltage on the occasion of a write operation of the memory transistor 3 and hence it is necessary to increase the withstand voltage of the high withstand voltage MOS transistor 1. In the light of the foregoing, it has been desired that a structure for facilitating implementation of an increased withstand voltage as compared with that of ordinary transistors it provided.

In order to facilitate the understanding of the present invention, first a conventional MOS transistor will be described. FIG. 2 is a sectional view showing a conventional MOS transistor (a field effect transistor) of a general structure. The FIG. 2 transistor comprises a P-type substrate 10, N+ type source 11 and drain 12 formed on one main surface of the P-type substrate 10 spaced apart form each other, and a gate 13 formed above the channel region formed between the source 11 and drain 12 through a gate oxide film 14.

In the case of the thus structured MOS transistor, the withstand voltage thereof is determined by either a junction withstand voltage in the vicinity of the drain 12 or a punch-through withstand voltage between the source 11 and the drain 12, which is lower. Now considering a case where the gate 13 and the source 11 are connected to the ground and a high voltage is applied to the drain 12, as shown in FIG. 2, then the shape of a depletion layer 15 on the side of the drain 12 becomes expanded as shown by the dotted line in FIG. 2. More specifically, the depletion layer 15 in the vicinity of the gate oxide film 14 is narrowed due to the influence of the gate electrode 13. Furthermore, when the voltage applied to the drain electrode D is increased, a strong electric field cannot be withstood in the vicinity of the point Ⓐ in the figure and as a result an avalanche breakdown phenomenon occurs. On the other hand, in the case where the distance between the source 11 and the drain 12, i.e. the channel length is extremely small, a so-called punch-through phenomenon occurs in which the point Ⓑ shown in the figure reaches the source region 11. In the case of either phenomenon a large amount of current flows and the heat caused thereby is likely to result in damage of the transistor. Meanwhile, the thinner the gate oxide film 14 and the thinner the impurity layer of the drain 12, the more easily the avalanche breakdown phenomenon occurs at the point Ⓐ shown in the figure.

In an actual example, an MOS transistor was fabricated by employing a silicon wafer of the resistivity of 20 Ω·cm as the P-type substrate 10 and by selecting the thickness of the gate oxide film to be 700 Å and by selecting various values as the distance between the source 11 and the drain 12 and the withstand voltage of the drain 12 (which is defined as a voltage when a current of 1 μA flows from the drain) in the case where the potentials of the gate 13 and the source 11 are forced to the ground as shown in FIG. 2 was measured. Then the result as shown in FIG. 3 was obtained. As is clear from FIG. 3, the withstand voltage becomes large in approximate proportion to the distance l between the source 11 and the drain 12 until the distance l reaches 3μ; however, the withstand voltage becomes constant which is approximately 21 V, after the distance l between the source 11 and the drain 12 exceeds 3μ. The reason is that the punch-through phenomenon is a factor dominantly controlling the withstand voltage until the distance l becomes 3μ, whereas after the distance l exceeds 3μ the junction breakdown phenomenon in the vicinity of the drain 12 comes to determine the withstand voltage.

As seen from the foregoing result, a decrease in the withstand voltage due to the punch-through phenomenon can be obviated by increasing the distance l between the source 11 and the drain 12 and, since the circuit where a high voltage is applied is restricted even in the case of an integrated circuit employing an erasable and programmable read only memory as a memory transistor, an increase in the distance between the source 11 and the drain 12 only in that portion exerts little influence upon the whole circuit; however, the withstand voltage due to the junction breakdown phenomenon is liable to be influenced by the thickness of the gate oxide film 14 and the depth or geometry of the source 11 and the drain 12. Therefore, in the case where the thickness of the gate oxide film and the depth of the source and drain of circuit components other than the high withstand voltage transistor 1, such as the memory transistor 3, are decreased in order to enhance the degree of integration of an integrated circuit as a whole, it unavoidably follows that the same thickness and depth are used also for the high withstand voltage transistor 3 due to restriction in the manufacturing process and it is substantially impossible to make changes to only the portion of the high withstand voltage transistor 3, with the result that the withstand voltage of the high withstand voltage transistor 3 is necessarily decreased and it was difficult to attain a withstand voltage larger than the result obtained shown in FIG. 3.

A field effect transistor having a two-layered gate structure as shown in FIGS. 4 to 6 has been proposed for the purpose of increasing the junction withstand voltage in such field effect transistor requiring a high withstand voltage. FIG. 4 is a plan view of such a conventional field effect transistor having a two-layered gate structure, FIG. 5 is a sectional view taken along the line V—V shown in FIG. 4, and FIG. 6 is a sectional view of the FIG. 4 transistor taken along the line VI—VI in FIG. 4. The conventional field effect transistor of a two-layered gate structure shown in FIGS. 4 to 6 comprises a P-type substrate 20, N+ type source 21 and drain 22 formed on one main surface of the P-type substrate spaced apart from each other, a first gate 23 formed above the channel region defined between the source 21 and the drain 22 through a first gate oxide film 24 so as to be overlapped onto the source 21 at one end thereof, a second gate 25 formed above the first gate 23 and above the channel region defined between the source 21 and the drain 22 through a second gate oxide film 26 and so as to bridge the first gate 23 and the drain 22, an isolating oxide film 27 of a field region for isolating the respective devices, and a channel cut region 28 formed by diffusing a P-type impurity such as boron beneath the isolating oxide film.

The thus structured field effect transistor was fabricated by using a silicon wafer of the resistivity of 20 Ω·cm as the P-type substrate 20, by selecting the thickness of the first gate oxide film 24 to be 700 Å, by selecting the thickness of the second gate oxide film 26 to be 1100 Å, by selecting the thickness of the oxide film between the first gate 23 and the second gate 25 to be 1300 Å, and by selecting various values of the channel length $l_1$ of the channel region immediately beneath the first gate 23, and the withstand voltage of the drain 22 of the thus fabricated field effect transistor when the first gate 23 and the source 21 are connected to the ground and the second gate 25 is connected to the drain 22, as shown in FIG. 5, was measured. As a result, substantially the same tendency as shown in FIG. 3 was exhibited, in which the withstand voltage increases in approximate proportion to the channel length $l_1$ until the channel length $l_1$ reaches 5.5μ, whereas the same becomes constant in the vicinity of 33 V after the channel length $l_1$ exceeds 5.5μ. The reason why the withstand voltage is increased as compared with that shown in FIG. 2 is that when a high voltage is applied to the drain 22 an inversion layer 29 is formed beneath the second gate 25 and a depletion layer 30 is further formed, when the electric field through the depletion layer 30 is drastically mitigated as compared with that shown in FIG. 2 and a breakdown voltage at that portion is increased to a much higher value.

More specifically, the withstand voltage of the thus structured field effect transistor is determined by the breakdown voltage at the portion where the channel region is contiguous to the isolating oxide film 27 and the first gate 23 overlaps to the isolating oxide film 27, i.e. the portion denoted by Ⓒ shown in FIG. 6.

However, the withstand voltage of the thus structured field effect transistor is approximately 33 V and has not been significantly improved. In other words, the breakdown voltage at the portion denoted as Ⓒ in FIG. 6 of the thus structured field effect transistor is still low. The reason for this is presumably accounted for as follows. More specifically, the channel cut region 28 has been formed immediately beneath the isolating oxide film 27 by diffusing a P-type impurity so that a channel may be formed beneath the oxide film 27 to prevent passage of a leakage current even in the case where a high voltage is applied onto the isolating oxide film 27, expansion of the depletion layer 30 is suppressed at the portion where the channel portion is contiguous thereto due to influence of the concentration of the impurity and as a result the depletion layer 30 at that portion becomes narrower, with the result that, as the channel potential increases the electric field becomes locally larger at that portion, which can not be eventually withstood and hence can cause a breakdown phenomenon. Meanwhile, in some cases an impurity is also diffused into the channel portion for the purpose of adjusting a threshold voltage, in which case the concentration thereof is extremely small and little influences the breakdown phenomenon inasmuch as the concentration of the channel cut region 28 is much larger than the concentration of that impurity.

SUMMARY OF THE INVENTION

In brief, the present invention comprises a field effect transistor and a semiconductor memory device employing such field effect transistor, comprising a semiconductor substrate of a first coductivity type, a drain region of a second conductivity type formed on one main surface of the semiconductor substrate, a source region of a second conductivity type formed annularly on one main surface of the semiconductor substrate encompassing the drain region and spaced apart therefrom, a channel region formed on one main surface of the semiconductor substrate between the drain region and the source region, wherein a portion of the channel region in the vicinity of the drain region constitutes a second channel region, whereas the remaining portion constitutes a first channel region, a first annular gate formed encompassing the drain region and bridging above the first channel region and the source region, with a first insulating film formed between the first gate and the first channel region, a second annular gate formed encompassing the drain region and above the second channel region through a second insulating film, bridging above the first gate and the drain region, with a predetermined voltage applied thereto for forming an inversion layer in the second channel region, and an isolating film formed contiguous to a source region at the side opposite to the channel region.

Since the inventive field effect transistor is structured such that a second gate is formed annularly to encompass a drain, there is no region where the channel region in the vicinity of the drain side end of the first gate is in contact with the isolating film. In a conventional field effect transistor, the breakdown voltage at that region restricted withstand voltage of field effect transistor. However, according to the present invention, it was confirmed that elimination of such region considerably enhances the withstand voltage of the inventive field effect transistor.

According to a semiconductor memory device employing the inventive field effect transistor, the length of the second channel region of the inventive field effect transistor is shorter than the length of the first channel region. As a result, it was confirmed that no inconvenience is caused on the occasion of a write operation of the memory field effect transistor and the electric characteristic was enhanced due to an increased mutual conductance.

Accordingly, a principal object of the present invention is to provide an improved two-layered gate field effect transistor having a high withstand voltage and a semiconductor memory device employing such field effect transistor.

An advantage of the present invention is that since the second gate is annularly formed to encompass the drain, a region is eliminated in which the channel region of the first gate in the vicinity of the drain side end is in contact with the isolating film, whereby a field effect transistor of a high withstand voltage is obtained.

Another advantage of the present invention is that a high voltage operation can be achieved with a field effect transistor employed in a large scale integration in which the thickness of a gate oxide film is selected to be thinner and the thickness of the impurity layers of the source and drain in the substrate is selected to be thinner for the purpose of a higher speed and larger scale of integration.

A further advantage of the present invention is that in employing a field effect transistor as a semiconductor memory device, being connected in series with a memory transistor including an erasable and programmable read only memory, no inconvenience is caused in the write operation of the memory transistor and a higher withstand voltage can be attained without degrading the electric characteristic, by selecting the length of the channel region immediately beneath the second gate to be shorter than the length of the channel region immediately beneath the first gate.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 7:
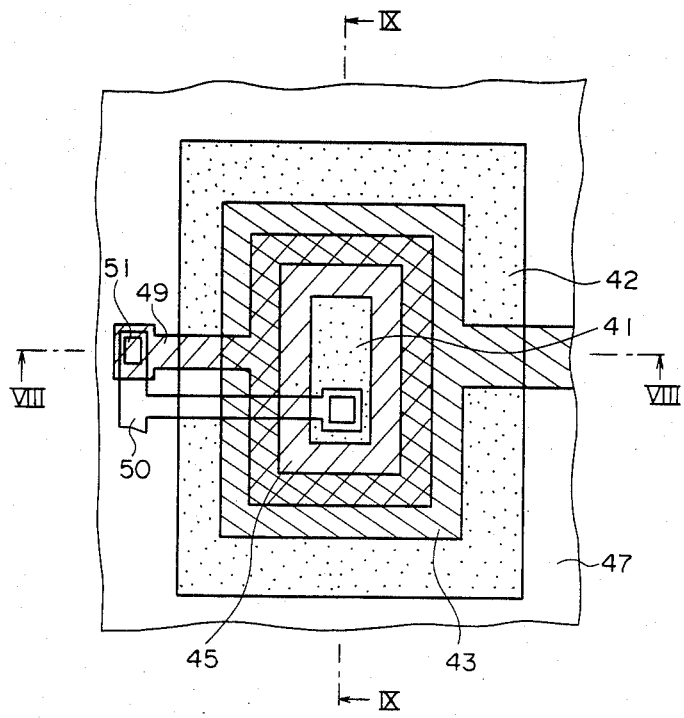
FIG. 7 is a plan view of one embodiment of the present invention.
Figure 8:
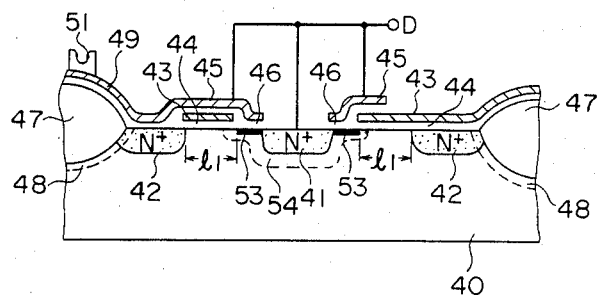
FIG. 8 is a sectional view of the FIG. 7 embodiment taken aong the line VIII—VIII in FIG. 7.
Figure 9:
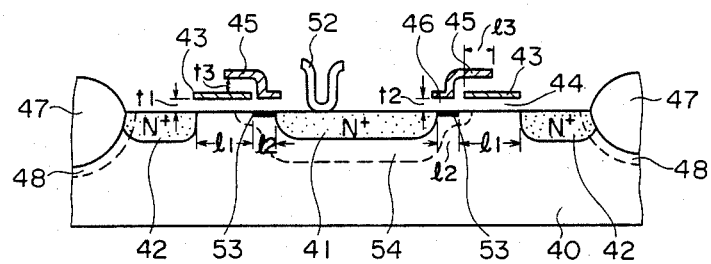
FIG. 9 is a sectional view of the FIG. 7 embodiment taken along the line IX—IX in FIG. 7.

Now one embodiment of the present invention will be described with reference to FIGS. 7 to 9. FIG. 7 is a plan view of one embodiment of the present invention, FIG. 8 is a sectional view of the FIG. 7 embodiment taken along the line VIII—VIII in FIG. 7, and FIG. 9 is a sectional view of the FIG. 7 embodiment taken along the line IX—IX in FIG. 7. The embodiment of the present invention shown in FIGS. 7 to 9 comprises a P-type substrate 40, an N+ type drain 41 formed on one main surface of the P-type substrate, an annular N+ type source 42 formed on the one main surface of the above described P-type substrate 40 spaced apart from the drain 41 so as to encompass the drain 41, whereby a channel region is formed between the drain 41 and the source 42, a first annular gate 43 formed above a first region of the channel region through a first gate oxide film 44 so as to overlap the source 42 at the outer periphery thereof, a second annular gate 45 formed above the first gate and above a second region of the channel region through a second gate oxide film 46 so as to bridge the first gate 43 and the drain 41, an isolating oxide film 47 of the field region for isolating the respective devices to be contiguous to the source 42 at the end thereof and to be annular, a channel cut region 48 formed by diffusing a P-type impurity such as boron beneath the isolating oxide film, a wiring layer 49 formed simultaneously with the second gate 45 for connecting the second gate 45 and an aluminum wiring 50 through a contact aluminum 51, a contact aluminum 52 for connecting the aluminum wiring 50 and the drain 41, an inversion layer 53 formed on the main surface of the P-type substrate 40 by the second gate 45, and a depletion layer region 54 extending immediately beneath the drain 41 and the inversion layer 53. Preferably, the concentration of the impurity diffused to form the channel cut region is larger than the concentration of the substrate at the region between the source and drain.

Figure 1:
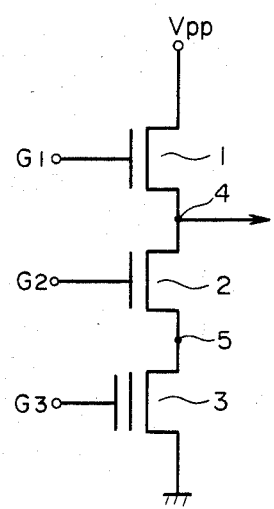
FIG. 1 is a schematic diagram of one bit of a large scale integration memory using an erasable and programmable read only memory as a memory transistor.
Figure 2:
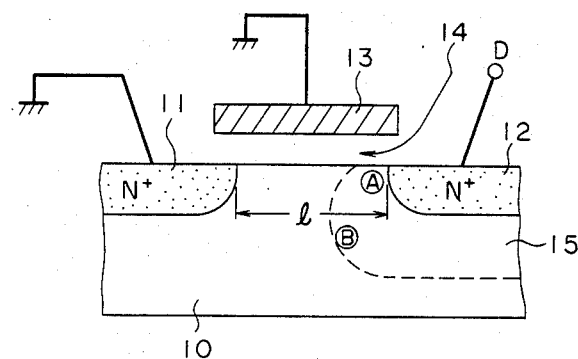
FIG. 2 is a sectional view of a conventional field effect transistor.
Figure 3:
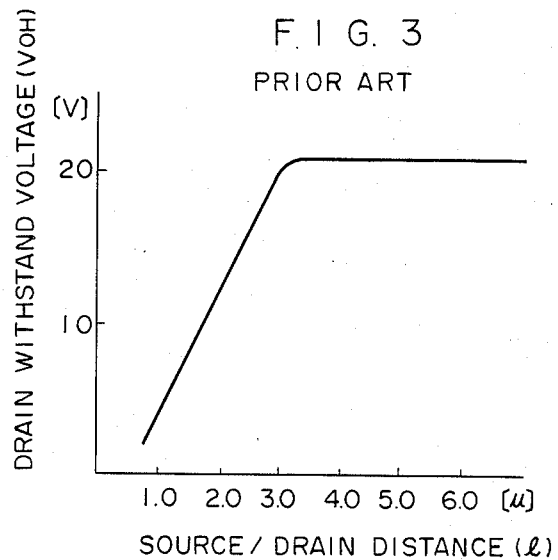
FIG. 3 is a graph showing the relation between the source/drain distance and the drain withstand voltage of the conventional field effect transistor.
Figure 4:
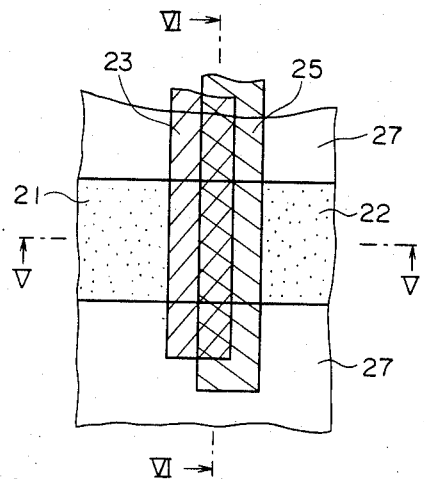
FIG. 4 is a plan view of a conventional field effect transistor of a two-layered gate structure.
Figure 5:
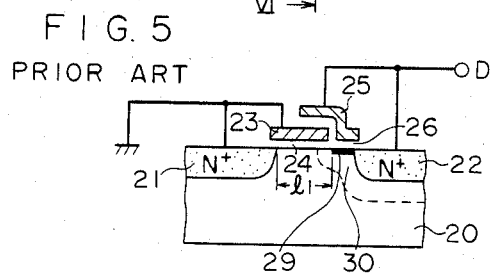
FIG. 5 is a sectional view of the FIG. 4 transistor taken along the line V—V in FIG. 4.
Figure 6:
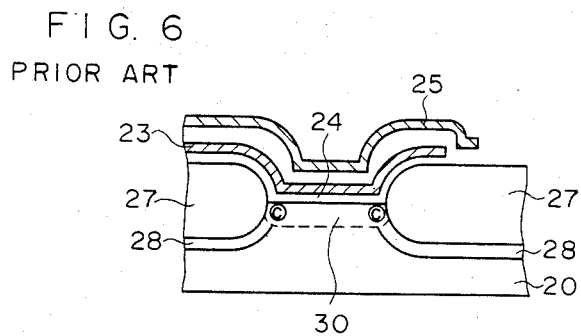
FIG. 6 is a sectional view of the FIG. 4 transistor taken along the line VI—VI in FIG. 4.

Since the second gate 45 is formed to be annular to encompass the drain 41 in the embodiment, no portion is formed where the channel region close to the first gate 43 on the side of the drain 41 is contiguous to the isolating oxide film 47, whereby a portion determining the withstand voltage shown in FIGS. 4 to 6 can be eliminated, with the result that the withstand voltage can be enhanced.

More specifically, the field effect transistor of the above described structure was fabricated by using a semiconductor wafer of the resistivity of 20 Ω·cm as the P-type substrate 40, by selecting the thickness $t_1$ of the first gate oxide film 44 to be 700 Å, by selecting the thickness $t_2$ of the second gate oxide film 46 to be 1100 Å, by selecting the thickness $t_3$ of the oxide film between the first gate 43 and the second gate 45 to be 1300 Å, by using arsenide as an impurity of the source 42 and the drain 41, by selecting the depth thereof to be 0.5μ, and by selecting various values of the channel length $l_1$ of the first region of the channel region immediately before the first gate 43 and the withstand voltage of the drain 41 of the thus fabricated field effect transistor was measured when the first gate 43 and the source 42 are connected to the ground and the second gate 45 is connected to the drain 41, as shown in FIG. 8. As a result, substantially the same tendency as shown in FIGS. 4 to 6 is exhibited, in which the withstand voltage is increased in approximate proportion to the channel length $l_1$ until the channel length $l_1$ reaches 5.5μ and a withstand voltage as high as 45 V was attained when the channel length $l_1$ is 5.5μ and the withstand voltage remains approximately a constant value after the channel length $l_1$ exceeds 5.5μ.

Meanwhile, when the channel length $l_1$ is 5.5μ, the overlapping between the first gate 43 and the source 42 was 0.5μ, and the second region of the channel region immediately beneath the second gate 45, i.e. the length $l_2$ of the inversion layer 53 was 3.0μ, and the overlapping between the first gate 43 and the second gate 45 was 3.0μ.

Figure 10:
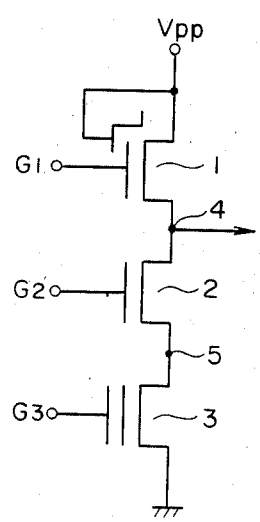
FIG. 10 is similar to FIG. 1 and is a schematic diagram of one bit of a large scale integration memory employing the inventive transistor.
Figure 12:
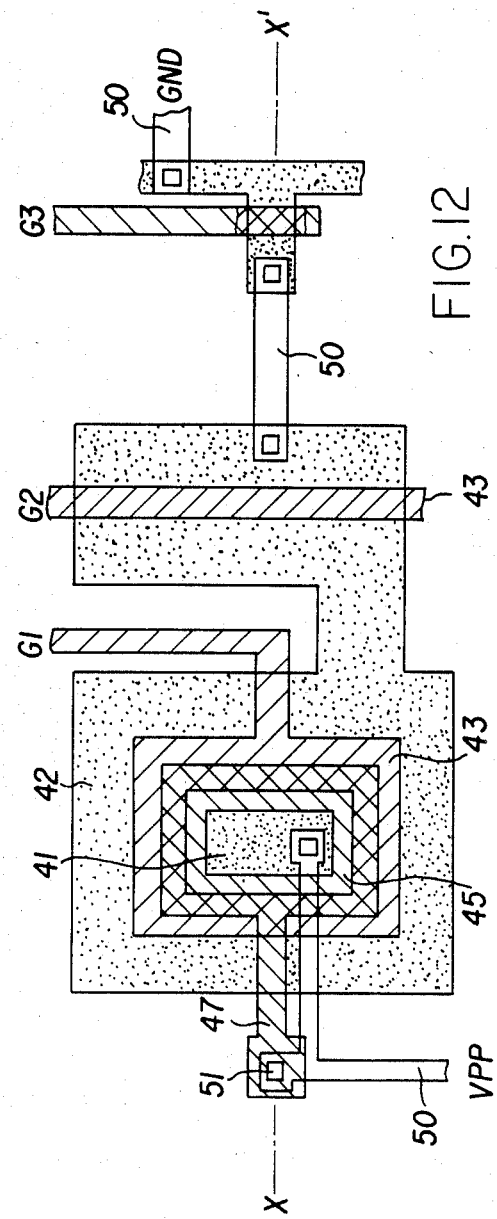
FIGS. 12 and 13 illustrate an embodiment of the invention incorporated in a three transistor memory arrangement.
Figure 13:
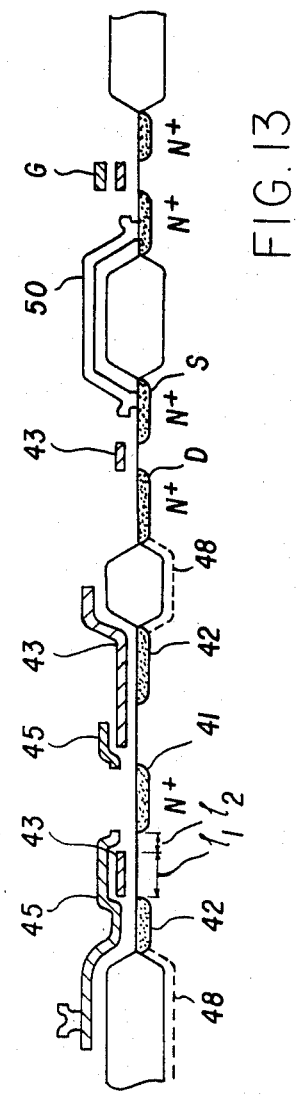

On the other hand, in the case where the above described field effect transistor having the withstand voltage thus improved is incorporated in a large scale integration memory employing such an erasable and programmable read only memory as shown in FIGS. 10 and 12–13 as the memory transistor 3, it was observed that a close relation exists between the channel length $l_1$ of the first region of the channel region immediately beneath the first gate 43 and the length $l_2$ of the second region of the channel region immediately beneath the second gate 45.

Figure 11:
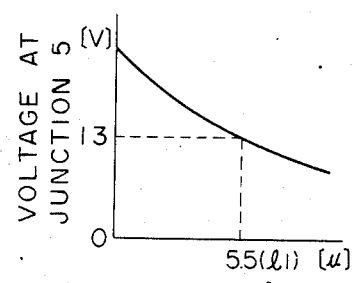
FIG. 11 is a graph showing the relation between the first region length $l_2$ of the channel region immediately beneath the second gate and the drain voltage of the memory transistor.

Now the channel length $l_1$ of the first region of the channel region immediately beneath the first gate 43 was selected to be 5.5μ, and the remaining conditions were selected to be the same as those described in the foregoing, and various values were adopted for the length $l_2$ of the second region of the channel region immediately beneath the second gate 45 while the voltage $V_{PP}$ was selected to be 21 V, and the relation between the length $l_2$ and the voltage at the junction 5 of the Y-gate MOS transistor 2 and the memory transistor 3, i.e. the relation between the length $l_2$ and the drain voltage of the memory transistor 3 was investigated and the result as shown in FIG. 11 was obtained. Of course, the length of the first channel region may be selected to be larger than 5.5μ.

As seen from FIG. 11, the longer the length $l_2$, the smaller the voltage at the junction 5 and when the length $l_2$ reaches 5.5μ, i.e. becomes the same length as the channel length $l_1$, the voltage at the junction 5 becomes 13 V, when a drain voltage minimum necessary for a writing operation of the memory transistor 3 was attained, and when the voltage becomes lower than that, a writing operation to the memory transistor 13 became impossible. More specifically, it was observed that it is necessary to select the length $l_2$ to be shorter than the channel length $l_1$. Meanwhile, the withstand voltage of the field effect transistor 1 at that time is determined by the channel length $l_1$ irrespective of the length $l_2$ (corresponding to the length of the inversion layer 53) due to formation of the inversion layer 53 immediately beneath the second gate 45 and was 45 V. In addition, since the field effect transistor 1 is structured such that substantially the effective length $l$ $(=l_1+l_2)$ of the channel portion may be shorter by selecting the length $l_2$ to be shorter than the channel length $l_1$ determined by the relation of the withstand voltage, an advantage is brought about that an electric characteristic is improved. More specifically, the larger the mutual conductance gm the better the electrical characteristic, wherein the mutual conductance gm is in an inverse proportional relation with the effective length $l$ $(=l_1+l_2)$ of the channel portion of the transistor when a channel is formed beneath the first gate 43 through application of a high voltage to the first gate 43 and the electric field transistor 1 is placed in a conductive state. Thus, the electrical characteristic of the above described field effect transistor having the length $l_2$ shortened can also be enhanced.

FIGS. 12 and 13 explicitly illustrate the plan and sectional views of the three transistor arrangement of FIG. 10 as incorporating the structure of FIGS. 7 and 8 therein. As shown therein, three transistors include a first transistor having an annular two-gate structure connected to a second field effect transistor which, in turn, is connected to yet a third field effect transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect transistor, comprising:
a semiconductor substrate of a first conductivity type,
a drain region of a second conductivity type formed on one main surface of said semiconductor substrate,
a source region of the second conductivity type formed annularly on said one main surface of said semiconductor substrate, said source region encompassing said drain region and spaced apart therefrom,
a channel region formed on said one main surface of said semiconductor substrate between said drain region and said source region, wherein a portion of said channel region in the vicinity of said drain region constitutes a second channel region, whereas a remaining portion of said channel region constitutes a first channel region,
a first annular gate encompassing said drain region bridging above said first channel region and said source, a first insulating thin film formed between said first annular gate and said first channel region, a second annular gate encompassing said drain region and above said second channel region through a second insulating thin film and bridging above said first gate and said drain region, said first and second insulating thin films separating the first and second gates respectively from the first and second channel regions formed in the substrate being thin films having substantially similar thicknesses, said second annular gate electrically connected to said drain region, voltage supply means coupled to said drain region and to said second annular gate for supplying a predetermined voltage to said drain region for forming an inversion layer in the second channel region, and an isolating film formed contiguous to said source region at the side opposite to said channel region.

2. A field effect transistor in accordance with claim 1, wherein an impurity of said first conductivity type is diffused beneath said isolating film into said semiconductor substrate, wherein the concentration of said impurity is selected to be larger than that of an impurity of said first conductivity type of said channel region.

3. A semiconductor memory device, comprising:

a first field effect transistor, comprising a first semiconductor substrate of a first conductivity type, a drain region of a second conductivity type formed on one main surface of said semiconductor substrate, a source region of a second conductivity type formed annularly on one main surface of said semiconductor substrate encompassing said drain region and spaced apart therefrom, a channel region formed on one main surface of said semiconductor substrate between said drain region and said source region, wherein a portion of said channel region in the vicinity of said drain region constitutes a second channel region, whereas a remaining portion said channel region constitutes a first channel region, the length of said second channel region is shorter than that of said first channel region, a first annular gate formed encompassing said drain region bridging above said first channel region and said source region, with a first insulating film formed between said first annular gate and said first channel region, a second annular gate formed encompassing said drain region and above said second channel region through a second insulating film and bridging above said first gate and said drain region, said second annular gate being electrically connected to said drain said first and second insulating films separating the first and second gates respectively from the first and second channel regions formed in the substrate being thin films having substantially similar thicknesses, and an isolating film formed contiguous to said source region at the side opposite to said channel region, a second field effect transistor including source, a gate, and a drain and having said drain of said second field effect transistor connected to said source region of said first field effect transistor, and a third field effect transistor for a memory including source, a gate and a drain and having said drain of said third field effect transistor connected to said source of said second field effect transistor.

4. A semiconductor memory device in accordance with claim 3, wherein an impurity of said first conductivity type is diffused beneath said isolating film into said semiconductor substrate of said first field effect transistor, wherein the concentration of said impurity is selected to be larger than that of an impurity of said first conductivity type of said channel region.

5. A semiconductor memory device in accordance with claim 3, wherein the length of the said first channel region of said first field effect transistor is larger than $5.5\mu$.

6. A field effect transistor comprising:

a semiconductor substrate of a first conductivity type, a drain region of a second conductivity type formed on one main surface of said semiconductor substrate, a source region of the second conductivity type formed annularly on said one main surface of said semiconductor substrate, said source region encompassing said drain region and spaced apart therefrom, a channel region formed on said one main surface of said semiconductor substrate between said drain region and said source region, wherein a portion of said channel region in the vicinity of said drain region constitutes a second channel region, whereas a remaining portion of said channel region constitutes a first channel region, said second channel region having a length in a direction from said drain region to said source region which is shorter than a length of said first channel region, a first annular gate formed encompassing said drain region bridging above said first channel region and said source, a region with a first insulating film formed between said first annular gate and said first channel region, a second annular gate formed encompassing said drain region and above said second channel region through a second insulating film and bridging above said first gate and said drain region, said first and second insulating films separating the first and second gates respectively from the first and second channel regions formed in the substrate being thin films having substantially similar thicknesses, voltage supply means coupled to said drain region for supplying a predetermined voltage to said drain region for forming an inversion layer in the second channel region, and an isolating film formed contiguous to said source region at the side opposite to said channel region.

7. A field effect transistor as recited in claim 1 further comprising a gate oxide film region between said first gate and said one main surface of said semiconductor substrate, in combination with a structural arrangement for incorporating thin layers of said gate oxide film in said field effect transistor and for providing to said field effect transistor an increased withstand voltage characteristic.

8. A field effect transistor as recited in claim 7 wherein said structural arrangement includes a length of said first channel region which is longer than the length of the second channel region; and an electrical connection between the second annular gate and the drain region, together with an impurity of said first conductivity type provided in said semiconductor substrate beneath said isolating film and having an impurity concentration greater than that of said channel region.

9. A field effect transistor, comprising:
a semiconductor substrate of a first conductivity type,
a drain region of a second conductivity type formed on one main surface of said semiconductor substrate,
a source region of the second conductivity type formed annularly on said one main surface of said semiconductor substrate, said source region encompassing said drain region and spaced apart therefrom,
a channel region formed on said one main surface of said semiconductor substrate between said drain region and said source region, wherein a portion of said channel region in the vicinity of said drain region constitutes a second channel region, whereas a remaining portion of said channel region constitutes a first channel region,
a first annular gate formed encompassing said drain region bridging above said first channel region and said source, a region with a first insulating film formed between said first annular gate and said first channel region,
a second annular gate formed encompassing said drain region and above said second channel region through a second insulating film and bridging above said first gate and said drain region,
said first and second insulating films separating the first and second gates respectively from the first and second channel regions formed in the substrate being thin films having substantially similar thicknesses, means for applying a predetermined voltage to said second annular gate for forming an inversion layer immediately beneath said second annular gate in the second channel region, and
an isolating film formed contiguous to said source region at the side opposite to said channel region, whereby an increased withstand voltage is provided to the transistor.

10. A field effect transistor as recited in claim 9 wherein said means for applying said predetermined voltage to said second annular gate means comprises connecting means for electrically connecting said second annular gate to said drain region.

11. A field effect transistor as recited in claim 10 wherein said first and second annular gates are formed in a non-connected arrangement.

12. A field effect transistor as recited in claim 1 further comprising means for connecting said drain region and said second gate region to a common electrical potential.

13. A field effect transistor in accordance with claim 1, wherein the length of said first channel region is larger than 5.5μ.

14. A semiconductor memory device, comprising:
a first field effect transistor, comprising
a semiconductor substrate of a first conductivity type,
a drain region of a second conductivity type formed on one main surface of said semiconductor substrate,
a source region of said second conductivity type formed annularly on said one main surface of said semiconductor substrate encompassing said drain region and spaced apart therefrom,
a channel region formed on said one main surface of said semiconductor substrate between said drain region and said source region, wherein a portion of said channel region in the vicinity of said drain region constitutes a second channel region, whereas a remaining portion of said channel region constitutes a first channel region, the length of said second channel region is shorter than that of said first channel region,
a first annular gate encompassing said drain region and bridging above said first channel region and said source region, with a first insulating film formed between said first annular gate and said first channel region,
a second annular gate encompassing said drain region and above said second channel region, said second gate separate from said second channel region by a second insulating film and bridging above said first gate and said drain region, said second annular gate being electrically connected to said drain region,
said first and second insulating films separating the first and second gates respectively from the first and second channel regions formed in the substrate being thin films having substantially similar thicknesses,
means coupled to said drain region for forming an inversion layer in the second channel region, and
an isolating film formed contiguous to said source region at the side opposite to said channel region,
a second field effect transistor including a source, a gate, and a drain and having said drain of said second field effect transistor connected to said source region of said first field effect transistor, and
a third field effect transistor for a memory including a source, a gate and a drain and having said drain of said third field effect transistor connected to said source of said second field effect transistor.

15. A field effect transistor as recited in claim 1 wherein said first and second insulating films between said first annular gate and said one main surface of said semiconductor substrate, and between said second annular gate and said one main surface of said semiconductor substrate are relatively thin, further comprising a third relatively thin insulating film between a portion of said second annular gate bridging above said first annular gate and said first annular gate bridged thereby, whereby an increased withstand voltage characteristic is provided to said field effect transistor.

16. A field effect transistor as recited in claim 15 wherein said second relatively thin insulating film has a thickness sufficiently thin to permit formation of said inversion layer in said second channel region.

17. A field effect transistor as recited in claim 16 wherein said first relatively thin insulating film has a thickness of approximately 700 angstroms, said second relatively thin insulating film has a thickness of approximately 1100 angstroms, and said third relatively thin insulating film has a thickness of approximately 1300 angstroms.

18. A field effect transistor as recited in claim 1 wherein said channel regions under said first and second annular gates are substantially annular, said second region including said inversion layer formed therein is in contact at an inner diameter thereof with said drain region and at an outer diameter thereof with said first channel region.

19. A field effect transistor as recited in claim 15 wherein said second annular gate includes a first portion vertically displaced from an upper portion of said first annular gate and a second portion horizontally displaced from said first annular gate, said third relatively thin insulating film provided in a substantially vertical space between said first annular gate and said first portion of said second annular gate and in a substantially horizontal space between said first annular gate and said second portion of said second annular gate.

20. A field effect transistor as recited in claim 1 wherein said thicknesses of said first and second insulating thin films are within a range of approximately 50% of one another.

21. A field effect transistor as recited in claim 20 wherein said thicknesses of said first and second insulating thin films are within a range of approximately 40% of one another.

22. A field effect transistor as recited in claim 1 wherein said first insulating thin film has a thickness of approximately 700 angstroms and said second insulating thin film has a thickness of approximately 1100 angstroms.

* * * * *